United States Patent
Fujii et al.

(10) Patent No.: US 8,772,430 B2
(45) Date of Patent: Jul. 8, 2014

(54) SILICONE RESIN, SEALING MATERIAL, AND OPTICAL SEMICONDUCTOR DEVICE

(75) Inventors: Haruka Fujii, Osaka (JP); Hiroyuki Katayama, Osaka (JP)

(73) Assignee: Nitto Denko Corporation, Osaka (JP)

( * ) Notice: Subject to any disclaimer, the term of this patent is extended or adjusted under 35 U.S.C. 154(b) by 153 days.

(21) Appl. No.: 13/273,664

(22) Filed: Oct. 14, 2011

(65) Prior Publication Data
US 2012/0112211 A1   May 10, 2012

(30) Foreign Application Priority Data
Nov. 5, 2010   (JP) .................................. 2010-249094

(51) Int. Cl.
*C08G 77/20*   (2006.01)
(52) U.S. Cl.
USPC .............................................. 528/32; 528/31
(58) Field of Classification Search
USPC ..................................................... 528/31, 32
See application file for complete search history.

(56) References Cited

U.S. PATENT DOCUMENTS

| | | |
|---|---|---|
| 2004/0054047 A1 | 3/2004 | Lai et al. |
| 2009/0225640 A1 | 9/2009 | Manabe et al. |
| 2011/0112268 A1 | 5/2011 | Katayama |

FOREIGN PATENT DOCUMENTS

| | | |
|---|---|---|
| EP | 2 319 888 A1 | 5/2011 |
| JP | 2000-154252 A | 6/2000 |
| JP | 2002-069191 A | 3/2002 |
| JP | 2007 031619 * | 2/2007 |
| JP | 2007-031619 A | 2/2007 |
| JP | 2007-246880 A | 9/2007 |
| JP | 2010-095616 A | 4/2010 |
| JP | 2011-99075 A | 5/2011 |

OTHER PUBLICATIONS

JP 2007 031619 machine translation (2007).*
European Search Report issued in Application No. 1185390.9 dated Mar. 9, 2012.
European Search Report issued in counterpart EP Application No. 12189406.7 dated Mar. 4, 2013.
Notification of Reasons for Refusal dated Jan. 7, 2014, issued by the Japanese Patent Office in corresponding Application No. 2010-249094.

* cited by examiner

*Primary Examiner* — Kuo-Liang Peng
(74) *Attorney, Agent, or Firm* — Sughrue Mion, PLLC

(57) ABSTRACT

A silicone resin is obtained by allowing a cage octasilsesquioxane having a group represented by formula (1) below, to react with
  an alkenyl group-containing polysiloxane containing an alkenyl group having a molarity smaller than the molarity of the hydrosilyl group of the cage octasilsesquioxane
in the presence of a hydrosilylation catalyst:

[Chemical Formula 1]

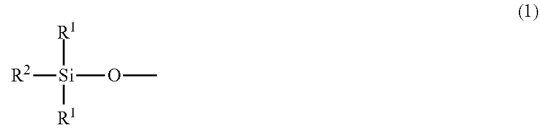

(1)

(where $R^1$ represents a monovalent hydrocarbon group, $R^2$ represents hydrogen or a monovalent hydrocarbon group, and the molar ratio of monovalent hydrocarbon group: hydrogen in $R^2$ in the cage octasilsesquioxane as a whole is, as an average value, in a range of 6.5:1.5 to 5.5:2.5).

5 Claims, No Drawings

SILICONE RESIN, SEALING MATERIAL, AND OPTICAL SEMICONDUCTOR DEVICE

CROSS-REFERENCE TO RELATED APPLICATION

The present application claims priority from Japanese Patent Application No. 2010-249094 filed on Nov. 5, 2010, the contents of which are hereby incorporated by reference into this application.

BACKGROUND OF THE INVENTION

1. Field of the Invention

The present invention relates to a silicone resin, a sealing material, and an optical semiconductor device, in particular, to a silicone resin, a sealing material composed of the silicone resin, and an optical semiconductor device in which the sealing material is used.

2. Description of Related Art

Conventionally, a silicone resin with excellent transparency has been used as a sealing material for an optical semiconductor element such as a light emitting diode (LED). Such a silicone resin is in a liquid state at room temperature, and the silicone resin is applied to the optical semiconductor element and cured by heating, thereby sealing in an optical semiconductor element.

Furthermore, in view of storage stability and handleability, a silicone resin that is in solid state at room temperature is also used. As such a solid silicone resin, for example, Japanese Unexamined Patent Publication No. 2000-154252 has proposed a silsesquioxane-containing polymer obtained by allowing pentacyclo[9.5.1.1$^{3.9}$.1$^{5.15}$.1$^{7.13}$]octasiloxane to react with 1,3-divinyltetramethyldisiloxane.

Also, Japanese Unexamined Patent Publication No. 2002-69191 has proposed a polysiloxane obtained by allowing hydrogenated octasilsesquioxane to react with disilanol.

The sealing materials proposed in Japanese Unexamined Patent Publication No. 2000-154252 and Japanese Unexamined Patent Publication No. 2002-69191 are plasticized by heating, thereby sealing optical semiconductor elements.

SUMMARY OF THE INVENTION

However, in view of improving heat resistance and durability, it has been desired that a solid silicone resin is plasticized by heating, and then cured. However, the sealing materials of Japanese Unexamined Patent Publication No. 2000-154252 and Japanese Unexamined Patent Publication No. 2002-69191 are disadvantageous in that they cannot be cured.

An object of the present invention is to provide a silicone resin having excellent transparency and heat resistance, and also having both thermoplastic and thermosetting characteristics; a sealing material composed of the silicone resin; and an optical semiconductor device in which the sealing material is used.

A silicone resin of the present invention is obtained by allowing a cage octasilsesquioxane having a group represented by formula (1) below to react with an alkenyl group-containing polysiloxane containing an alkenyl group having a molarity smaller than the molarity of the hydrosilyl group of the cage octasilsesquioxane in the presence of a hydrosilylation catalyst:

[Chemical Formula 1]

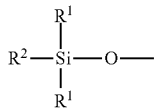

(1)

(where $R^1$ represents a monovalent hydrocarbon group, $R^2$ represents hydrogen or a monovalent hydrocarbon group, and the molar ratio of monovalent hydrocarbon group: hydrogen in $R^2$ in the cage octasilsesquioxane as a whole is, as an average value, in a range of 6.5:1.5 to 5.5:2.5).

In the silicone resin of the present invention, it is preferable that the cage octasilsesquioxane is represented by formula (2) below:

[Chemical Formula 2]

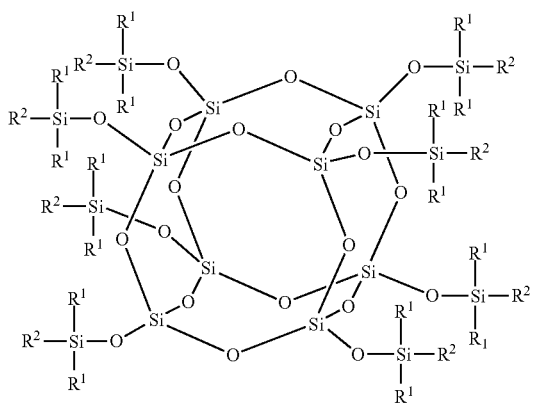

(2)

(where $R^1$ and $R^2$ are as defined above, and the molar ratio of monovalent hydrocarbon group: hydrogen in $R^2$ is as defined above).

In the silicone resin of the present invention, it is preferable that the alkenyl group-containing polysiloxane is represented by formula (3) below:

[Chemical Formula 3]

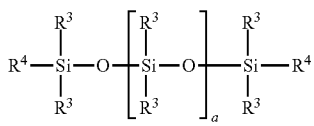

(3)

(where $R^3$ represents a monovalent hydrocarbon group, $R^4$ represents an alkenyl group, and "a" represents an integer of 1 or more).

A sealing material of the present invention is used for sealing in an optical semiconductor element, and is composed of the above-described silicone resin.

An optical semiconductor device of the present invention includes an optical semiconductor element, and the above-described sealing material that seals in the optical semiconductor element.

In the silicone resin of the present invention, the molar ratio of monovalent hydrocarbon group: hydrogen in $R^2$ is in a specific range, and therefore in the cage octasilsesquioxane, the proportion of the hydrosilyl group to be reacted with the alkenyl group in alkenyl group-containing polysiloxane is adjusted. Moreover, the alkenyl group-containing polysiloxane is allowed to react so that the alkenyl group therein has a molarity that is smaller than the molarity of the hydrosilyl group in the cage octasilsesquioxane. Thus, the obtained silicone resin has both thermoplastic and thermosetting characteristics. Furthermore, the silicone resin has excellent transparency and heat resistance.

Thus, the sealing material of the present invention is composed of the above-described silicone resin, and therefore the sealing material is plasticized by heating at the time of sealing, and then cured thereafter, thereby sealing in the optical semiconductor element.

Thus, in the optical semiconductor device of the present invention, the optical semiconductor element is sealed with the above-described sealing material, and therefore the optical semiconductor device of the present invention has excellent optical characteristics and heat resistance, and also has excellent mechanical strength and durability.

DETAILED DESCRIPTION OF THE INVENTION

A silicone resin of the present invention is obtained by allowing a cage octasilsesquioxane to react with an alkenyl group-containing polysiloxane in the presence of a hydrosilylation catalyst.

The cage octasilsesquioxane is an octamer of trifunctional silicone monomer, and to be specific, has eight groups represented by formula (1) below,

[Chemical Formula 4]

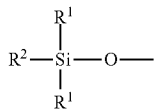
(1)

where $R^1$ represents a monovalent hydrocarbon group, and $R^2$ represents hydrogen or a monovalent hydrocarbon group. The molar ratio of monovalent hydrocarbon group: hydrogen in $R^2$ in the cage octasilsesquioxane as a whole is, as an average value, in the range of 6.5:1.5 to 5.5:2.5.)

To be more specific, the cage octasilsesquioxane is represented by formula (2) below.

[Chemical Formula 5]

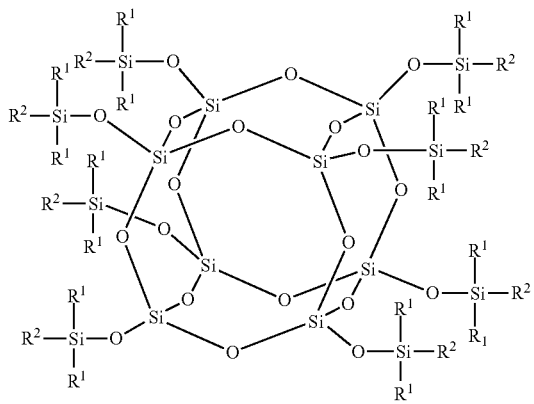
(2)

(where $R^1$ and $R^2$ are the same as described above. The molar ratio of monovalent hydrocarbon group: hydrogen in $R^2$ is the same as described above.)

Examples of monovalent hydrocarbon groups represented by $R^1$ in the above-described formulas (1) and (2) include a monovalent hydrocarbon group selected from a saturated hydrocarbon group and an aromatic hydrocarbon group.

To be specific, the examples include a straight chain saturated hydrocarbon group (e.g., an alkyl group having 1 to 6 carbon atoms such as methyl, ethyl, propyl, butyl, pentyl, and hexyl), a branched hydrocarbon group (e.g., an alkyl group having 3 to 6 carbon atoms such as isopropyl and isobutyl), a cyclic saturated hydrocarbon group (e.g., a cycloalkyl group having 3 to 6 carbon atoms such as cyclohexyl), and an aromatic hydrocarbon group (e.g., an aryl group having 6 to 8 carbon atoms such as phenyl).

The number of carbon atoms in the monovalent hydrocarbon group is, for example, 1 to 8, or preferably 1 to 6.

$R^1$ may be the same or different. Preferably, $R^1$ is the same.

Preferably, in view of easy preparation and thermal stability, a straight chain saturated hydrocarbon group, more preferably an alkyl group having 1 to 6 carbon atoms, and particularly preferably methyl is used as the monovalent hydrocarbon group.

In the above-described formulas (1) and (2), examples of the monovalent hydrocarbon group represented by $R^2$ include the above-described monovalent hydrocarbon group represented by $R^1$. A preferable example is methyl.

The molar ratio of monovalent hydrocarbon group: hydrogen in $R^2$ in formula (2), the cage octasilsesquioxane as a whole, is in the range of 6.5:1.5 to 5.5:2.5, or preferably 6.0:2.0 to 5.5:2.5 as an average value.

That is, in one molecule of the cage octasilsesquioxane, the group represented by the above-described formula (1) forms 1.5 to 2.5 (to be specific, two), or preferably 2 to 2.5 (to be specific, two) of hydrosilyl groups (—SiH).

When the above-described molar ratio of monovalent hydrocarbon group: hydrogen in $R^2$ exceeds 6.5/1.5 (=6.5: 1.5) (e.g., 7/1 (=7:1)), the molarity of the hydrosilyl group is excessively small, and therefore the reactivity of the cage octasilsesquioxane relative to the alkenyl group-containing polysiloxane drops excessively. Thus, the molecular weight of the silicone resin to be obtained is decreased, and a solid silicone resin cannot be obtained.

On the other hand, when the molar ratio of monovalent hydrocarbon group: hydrogen in the above-described $R^2$ is below 5.5/2.5 (=5.5:2.5) (e.g., 5/3 (=5:3)), and therefore the molarity of the hydrosilyl group of cage octasilsesquioxane is excessively large. Thus, reactivity of cage octasilsesquioxane relative to alkenyl group-containing polysiloxane excessively increases, and therefore the silicone resin does not exhibit thermoplasticity.

Examples of the above-described cage octasilsesquioxane include, to be specific, a cage octasilsesquioxane having methyl in $R^1$ and methyl or hydrogen in $R^2$ in the above-described formulas (1) and (2), and having a molar ratio of methyl: hydrogen in $R^2$ in the cage octasilsesquioxane as a whole of 5.5:2.5, 6:2, or 6.5:1.5 as an average value.

The cage octasilsesquioxane represented by the above-described formula (2) is synthesized, for example, by a known method (in accordance with e.g., Japanese Unexamined Patent Publication No. 2007-246880).

To be specific, tetraalkoxysilane (tetraethoxysilane, etc) is allowed to react with an alcohol such as methanol, and/or with water in the presence of a catalyst to synthesize an octa (silsesquioxane) skeleton (a portion in formula (2) excluding the groups of formula (1)), and thereafter, dialkylchlorosilane (dimethylchlorosilane, etc.) and trialkylchlorosilane (trimethylchlorosilane etc.) are blended at a mixing ratio corresponding to the molar ratio of the monovalent hydrocarbon group: hydrogen in the above-described $R^2$, thus allowing an alkoxyl group (ethoxy, etc.) bonded to the silicon atoms of the octa (silsesquioxane) skeleton to react with dialkylchlorosilane and trialkylchlorosilane. After the reaction, as necessary, the product is refined. The cage octasilsesquioxane can be obtained in this manner.

A commercially available product may also be used as the cage octasilsesquioxane.

The alkenyl group-containing polysiloxane is a polysiloxane containing an alkenyl group. To be specific, the alkenyl group-containing polysiloxane is represented by formula (3) below.

[Chemical Formula 6]

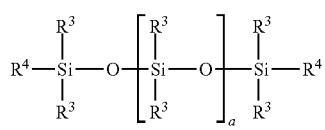

(3)

(where $R^3$ represents a monovalent hydrocarbon group, and $R^4$ represents an alkenyl group. "a" represents an integer of 1 or more.)

The monovalent hydrocarbon group represented by $R^3$ in formula (3) may be the same or different, and preferably the same.

Examples of the monovalent hydrocarbon group represented by $R^3$ in formula (3) include the monovalent hydrocarbon group represented by $R^1$ in the above-described formulas (1) and (2), and a preferable example is methyl.

Examples of the alkenyl group represented by $R^4$ in formula (3) include substituted or unsubstituted alkenyl group. A preferable example is an unsubstituted alkenyl group.

An example of such an alkenyl group includes an alkenyl group having 2 to 10 carbon atoms such as vinyl, allyl, propenyl, butenyl, and pentenyl.

The number of carbon atoms of the alkenyl group is, for example, 2 to 10, or preferably 2 to 5.

$R^4$ may be the same or different, and preferably, $R^4$ is the same.

Examples of the alkenyl group is, preferably, in view of reactivity of the cage octasilsesquioxane with the hydrosilyl group, an alkenyl group having 2 to 5 carbon atoms, and more preferably vinyl.

In view of reactivity and stability, "a" is preferably an integer of 1 to 5000, or more preferably an integer of 1 to 1000.

The number average molecular weight of the alkenyl group-containing polysiloxane represented by the above-described formula (3) is, in view of safety and handleability, for example, 100 to 10000, or preferably 300 to 5000. The number average molecular weight is measured by gel permeation chromatography (GPC).

The alkenyl group-containing polysiloxane represented by the above-described formula (3) is synthesized in accordance with, for example, a known method. Alternatively, a commercially available product (e.g., manufactured by Gelest, Inc.) may be used.

Examples of the hydrosilylation catalyst include platinum catalysts such as platinum black, platinum chloride, chloroplatinic acid, a platinum olefin complex, a platinum carbonyl complex, and platinum acetyl acetate; palladium catalysts; and rhodium catalysts.

Of these hydrosilylation catalysts, preferably, in view of compatibility and transparency, a platinum catalyst, more preferably a platinum olefin complex, to be specific, a platinum-1,3-divinyl-1,1,3,3-tetramethyldisiloxane complex, or a platinum-divinylsiloxane complex is used.

The hydrosilylation catalyst may be prepared as a solution in a known solvent (such as toluene).

The mixing ratio of the hydrosilylation catalyst (solid content) relative to 100 parts by mass of the total amount of cage octasilsesquioxane and alkenyl group-containing polysiloxane is, for example, $1.0 \times 10^{-10}$ to 3 parts by mass, or preferably $1.0 \times 10^{-8}$ to 1 parts by mass.

In the present invention, a cage octasilsesquioxane is allowed to react with an alkenyl group-containing polysiloxane in the presence of a hydrosilylation catalyst so that the molarity of the hydrosilyl group in the cage octasilsesquioxane is larger (excessive) than the molarity of the alkenyl group of the alkenyl group-containing polysiloxane.

The molar ratio (molarity of the alkenyl group/molarity of hydrosilyl group) of the alkenyl group to the hydrosilyl group is below 1, for example, 0.10 to 0.99, preferably 0.20 to 0.99, or more preferably 0.50 to 0.99.

On the other hand, when the above-described molar ratio exceeds the above-described range, the hydrosilyl group is fewer than the alkenyl group. In such a case, the excess of the hydrosilyl group does not remain after the reaction, and the thermosetting characteristics cannot be imparted to the silicone resin.

To allow the above-described cage octasilsesquioxane to react with alkenyl group-containing polysiloxane, they are blended at the above-described mixing ratio, along with a hydrosilylation catalyst and a solvent, and thereafter, as necessary, the mixture is heated.

Examples of the solvent include aromatic hydrocarbon such as toluene, aliphatic hydrocarbon such as hexane, and ester such as ethyl acetate. Preferably, in view of improving compatibility of the components, aromatic hydrocarbon, or more preferably toluene is used.

The reaction temperature is, for example, 0 to 100° C., or preferably 20 to 80° C., and the reaction time is, for example, 0.5 to 96 hours.

The hydrosilyl group of cage octasilsesquioxane and the alkenyl group of alkenyl group-containing polysiloxane are allowed to undergo hydrosilylation reaction in this manner.

The degree of the hydrosilylation reaction can be checked by 1H-NMR measurement based on the signal intensity derived from the alkenyl group of alkenyl group-containing polysiloxane, and the hydrosilylation reaction is regarded as ended when the signal disappeared.

In the above-described hydrosilylation reaction, the cage octasilsesquioxane is allowed to react with an alkenyl group-containing polysiloxane so that the molarity of the hydrosilyl group is excessive compared with the molarity of the alkenyl group. Therefore, after the reaction, the excess of the hydrosilyl group remains, and the excess of the hydrosilyl group is hydrolyzed with moisture in the air and undergoes a condensation reaction by heating (e.g., heating at 100 to 200° C.). The excess of the hydrosilyl group is bonded with each other (three-dimensional crosslinking), thus imparting thermosetting characteristics to the silicone resin.

The silicone resin of the present invention can be obtained in this manner.

The silicone resin thus obtained is solid. The silicone resin in a state of solid is obtained because mobility of the alkenyl group-containing polysiloxane is decreased due to the steric hindrance of the cage octasilsesquioxane.

An additive may be added at an appropriate ratio to the silicone resin within a range that does not damage excellent effects of the present invention. Examples of additives include antioxidants, modifiers, surfactants, dyes, pigments, discoloration inhibitors, ultraviolet absorbers, fillers, and phosphors.

The silicone resin is used, for example, as a sealing material in various industrial products. Preferably, the silicone resin is used as a sealing material for sealing in an optical semiconductor element.

The optical semiconductor element is not particularly limited as long as it is an element provided in an optical semiconductor device, and examples thereof include light emitting diodes (LED), photodiodes, phototransistors, and laser diodes. Preferable examples are LEDs, and more preferable examples are LEDs for lighting.

The above-described sealing material is disposed so as to cover the optical semiconductor element, and the sealing material is heated to, for example, a temperature (e.g., 100 to 300° C.) that causes the sealing material to be cured.

Then, the sealing material is once plasticized (or liquefied) by the above-described heating, sealing in the optical semiconductor element, and thereafter, cured.

Thermoplastic characteristics of the silicone resin are exhibited based on an increase in mobility of the cage octasilsesquioxane and the alkenyl group-containing polysiloxane by heating.

The plasticizing temperature of the silicone resin is, for example, 40 to 100° C., or preferably 50 to 90° C. The plasticizing temperature is a temperature at which the silicone resin exhibits thermoplasticity, to be specific, a temperature at which a solid silicone resin is softened and then completely liquefied by heating, and is substantially the same as the softening temperature.

The melting point of the silicone resin is, for example, 50 to 100° C., or preferably 60 to 90° C.

The thermosetting characteristics of the plasticized silicone resin are exhibited by hydrolysis and condensation reaction of the excess hydrosilyl group, causing the excess hydrosilyl group to bond with each other (three-dimensional crosslinking).

The curing temperature of the silicone resin is, for example, 150 to 300° C., or preferably 180 to 250° C. The curing temperature is a temperature at which the silicone resin exhibits thermosetting characteristics, to be specific, a temperature at which a liquid silicone resin is cured and then completely solidified by heating.

An optical semiconductor element, and an optical semiconductor device including a sealing material that seals in the optical semiconductor element are obtained in this manner.

In the silicone resin of the present invention, the molar ratio of monovalent hydrocarbon group: hydrogen in $R^2$ is within a specific range, and therefore in the cage octasilsesquioxane, the proportion of the hydrosilyl group to be reacted with the alkenyl group of alkenyl group-containing polysiloxane is adjusted. Furthermore, the alkenyl group-containing polysiloxane is allowed to react so that the alkenyl group thereof has a molarity that is smaller than the molarity of the hydrosilyl group of cage octasilsesquioxane. Therefore, the obtained silicone resin has both thermoplastic and thermosetting characteristics. Furthermore, the silicone resin has excellent transparency and heat resistance.

Thus, the sealing material of the present invention is composed of the above-described silicone resin, and therefore the sealing material can be plasticized by heating at the time of sealing, and then cured so as to seal in an optical semiconductor element.

Thus, in the optical semiconductor device of the present invention, optical semiconductor elements are sealed with the above-described sealing material, and therefore the optical semiconductor device has excellent optical characteristics and heat resistance, and also mechanical strength and durability.

EXAMPLES

While the present invention will hereinafter be described in further detail with reference to Synthesis Examples, Comparative Synthesis Examples, Examples, and Comparative Examples, the present invention is not limited to these Examples.

Synthesis Example 1

Synthesis of Cage Octasilsesquioxane 35.8 mL (160.6 mol) of tetraethoxysilane was gradually added dropwise to a liquid mixture of 66.8 mL (158.6 mol) of tetramethyl ammonium hydroxide (25% methanol solution), 32.8 mL of methanol, and 24.6 mL of distilled water. The mixture was stirred for a whole day, thereby allowing the mixture to react.

Then, the reaction liquid was filtrated, and the filtrate was added dropwise to a liquid mixture of 428 mL of hexane, 7.1 g (75 mmol) of dimethylchlorosilane, and 24.4 g (225 mmol) of trimethylchlorosilane. The mixture was stirred for a whole day. Thereafter, the product was extracted with hexane, and magnesium sulfate was added to the extract to be dried. Thereafter, hexane was removed once, and then thereafter added again to cause recrystallization, thereby producing a white solid cage octasilsesquioxane.

It was confirmed by NMR that the obtained cage octasilsesquioxane had the formula (2) structure; and $R^1$ was a methyl group and $R^2$ was hydrogen or a methyl group in formula (2). The molar ratio (in cage octasilsesquioxane as a whole, average value) of the methyl group to hydrogen in $R^2$ was calculated and determined to be methyl group: hydrogen=6:2.

Synthesis Examples 2 and 3, and Comparative Synthesis Examples 1 and 2

Cage octasilsesquioxanes of Synthesis Examples 2 and 3, and Comparative Synthesis Examples 1 and 2 were obtained in the same manner as in Synthesis Example 1, except that the mixing ratio of dimethylchlorosilane and trimethylchlorosilane was changed in accordance with Table 1.

It was confirmed by NMR that the obtained cage octasilsesquioxane had the formula (2) structure, the groups of $R^1$ and $R^2$ of formula (2) were identified, and the molar ratio (in cage octasilsesquioxane as a whole, average value) of the vinyl group to hydrogen of $R^2$ was calculated. The results are shown in Table 1.

TABLE 1

| | | | Synthesis Ex. 1 | Synthesis Ex. 2 | Synthesis Ex. 3 | Comp. Synthesis Ex. 1 | Comp. Synthesis Ex. 2 |
|---|---|---|---|---|---|---|---|
| Tetraethoxysilane | Blended | (g) | 35.8 | 35.8 | 35.8 | 35.8 | 35.8 |
| | Amount | (mmol) | 160.6 | 160.6 | 160.6 | 160.6 | 160.6 |
| Dimethylchlorosilane | Blended | (g) | 7.1 | 5.3 | 8.9 | 3.5 | 10.6 |
| | Amount | (mmol) | 75 | 56.3 | 93.8 | 37.5 | 112.5 |
| Trimethylchlorosilane | Blended | (g) | 24.4 | 26.5 | 22.4 | 28.5 | 20.4 |
| | Amount | (mmol) | 225 | 243.8 | 206.3 | 262.5 | 187.5 |
| Formulas (1) and (2) | $R^1$ | | Methyl Group | Methyl Group | Methyl Group | Methyl Group | Methyl Group |
| | $R^2$ | Methyl Group:Hydrogen (Molar Ratio) | 6:2 | 6.5:1.5 | 5.5:2.5 | 7:1 | 5:3 |

Example 1

0.36 g of the cage octasilsesquioxane (methyl group: hydrogen (molar ratio)=6:2 in $R^2$) of Synthesis Example 1, 0.24 g of an alkenyl group-containing polysiloxane (manufactured by Gelest, Inc., in formula (3), $R^3$ is methyl group, $R^4$ is vinyl group, "a" is 8, a number average molecular weight of 800), 1 g of toluene, and 0.5 μL of a platinum-divinylsiloxane complex solution (hydrosilylation catalyst, toluene solution, a platinum concentration of 2 mass %) were blended, and the mixture was stirred at 50° C. for 15 hours. The molar ratio (=vinyl group/hydrosilyl group) of the vinyl group of alkenyl group-containing polysiloxane and the hydrosilyl group of cage octasilsesquioxane was 0.91.

Thereafter, toluene was distilled away. A transparent, solid silicone resin was obtained in this manner.

Example 2

A transparent, solid silicone resin was obtained in the same manner as in Example 1, except that 0.6 g of an alkenyl group-containing polysiloxane (manufactured by Gelest, Inc. in formula (3), $R^3$ is methyl group, $R^4$ is vinyl group, "a" is 25, a number average molecular weight of 2000) was blended instead of 0.24 g of an alkenyl group-containing polysiloxane (manufactured by Gelest, Inc. in formula (3), $R^3$ is methyl group, $R^4$ is vinyl group, "a" is 8, a number average molecular weight of 800).

The molar ratio (=vinyl group/hydrosilyl group) of the vinyl group of alkenyl group-containing polysiloxane and the hydrosilyl group of cage octasilsesquioxane was 0.91.

Example 3

A transparent, solid silicone resin was obtained in the same manner as in Example 1, except that 0.2 g of the cage octasilsesquioxane (methyl group: hydrogen (molar ratio)=6.5:1.5 in $R^2$) of Synthesis Example 2 was blended instead of 0.3 g of the cage octasilsesquioxane (methyl group: hydrogen (molar ratio)=6:2 in $R^2$) of Synthesis Example 1.

The molar ratio (=vinyl group/hydrosilyl group) of the vinyl group of alkenyl group-containing polysiloxane and the hydrosilyl group of cage octasilsesquioxane was 0.91.

Example 4

A transparent, solid silicone resin was obtained in the same manner as in Example 1, except that 0.37 g of the cage octasilsesquioxane (methyl group: hydrogen (molar ratio)=5.5:2.5 in $R^2$) of Synthesis Example 3 was blended instead of 0.3 g of the cage octasilsesquioxane (methyl group: hydrogen (molar ratio)=6:2 in $R^2$) of Synthesis Example 1.

The molar ratio (=vinyl group/hydrosilyl group) of the vinyl group of alkenyl group-containing polysiloxane and the hydrosilyl group of cage octasilsesquioxane was 0.90.

Comparative Example 1

An opaque, oily silicone resin was obtained in the same manner as in Example 1, except that 0.24 g of the polysiloxane (manufactured by Gelest, Inc, in formula (3), both $R^3$ and $R^4$ are methyl groups, "a" is 25, a number average molecular weight of 800) that did not contain alkenyl groups was blended instead of 0.24 g of the alkenyl group-containing polysiloxane (manufactured by Gelest, Inc. in formula (3), $R^3$ is methyl group, $R^4$ is vinyl group, "a" is 8, a number average molecular weight of 800).

Comparative Example 2

A transparent, oily silicone resin was obtained in the same manner as in Example 1, except that 0.15 g of the cage octasilsesquioxane (methyl group: hydrogen (molar ratio)=7:1 in $R^2$) of Comparative Synthesis Example 1 was blended instead of 0.3 g of the cage octasilsesquioxane (methyl group: hydrogen (molar ratio)=6:2 in $R^2$) of Synthesis Example 1.

The molar ratio (=vinyl group/hydrosilyl group) of the vinyl group of alkenyl group-containing polysiloxane and the hydrosilyl group of cage octasilsesquioxane was 0.90.

Comparative Example 3

A transparent, solid (gelled) silicone resin was obtained in the same manner as in Example 1, except that 0.45 g of the cage octasilsesquioxane (methyl group: hydrogen (molar, ratio)=5:3) of Comparative Synthesis Example 2 was blended instead of 0.3 g of the cage octasilsesquioxane (methyl group: hydrogen (molar ratio)=6:2) of Synthesis Example 1.

The molar ratio (=vinyl group/hydrosilyl group) of the vinyl group of alkenyl group-containing polysiloxane and the hydrosilyl group of cage octasilsesquioxane was 0.91.

Comparative Example 4

An opaque, oily silicone resin was obtained in the same manner as in Example 1, except that the platinum-divinylsiloxane complex solution (hydrosilylation catalyst, toluene solution, a platinum concentration of 2 mass %) was not blended.

Evaluation
1. Thermoplastic and Thermosetting Characteristics

Behavior of silicone resins of Examples and Comparative Examples at the time of heating were evaluated.

To be specific, a sample of a square of 1 cm was taken from silicone resins of Examples 1 to 4 and Comparative Example 3. The sample was placed on a hot plate, and heated to 30 to 200° C. The plasticizing temperature and the thermosetting temperature of the sample were observed visually. The results are shown in Table 2.

The silicone resin of Comparative Example 3 was solid, but was not softened by heat, and therefore the plasticizing temperature could not be evaluated. The silicone resin of Comparative Example 3 was solid, and therefore the thermosetting temperature was not evaluated.

The silicone resins of Comparative Examples 1, 2, and 4 were liquid, and therefore the plasticizing temperature was not evaluated. A predetermined amount (about 1 mL) of the silicone resins of Comparative Examples 1, 2, and 4 were applied on a hot plate, and the silicone resins were heated to 30 to 200° C. The silicone resins were observed, but were not cured by heating. Therefore, the thermosetting temperature was not evaluated.

2. Melting Point Measurement

The melting point of the samples of Examples 1 to 4 obtained as described above was measured using a differential scanning calorimeter (DSC-6200, manufactured by SII NanoTechnology Inc.). The results are shown in Table 2.

The measurement conditions of the measurement with the differential scanning calorimeter were set to a scanning temperature of −100 to 200° C., and a temperature rising speed of 10° C./min.

3. Heat Resistance (Reduction Rate of Light Transmittance)

The transmittance of the light at a wavelength 450 nm of the above-described samples of Examples 1 to 4 was measured by a spectrophotometer (U4100, manufactured by Hitachi High-Technologies Corporation).

Thereafter, the samples were placed in a hot air dryer at 200° C. for a predetermined period of time. Then, the samples were taken out from the hot air dryer after the elapse of 24 hours and also 168 hours, and the transmittance of the light at a wavelength 450 nm of the sample was measured.

Then, the reduction rate of the light transmittance (=(light transmittance after placed in the dryer/light transmittance before placed in the dryer)×100) of the samples was measured. The results are shown in Table 2.

TABLE 2

|  |  | Example and Comp. Ex. | | | |
| --- | --- | --- | --- | --- | --- |
|  |  | Example 1 | Example 2 | Example 3 | Example 4 |
| Cage Octasilsesquioxane | Synthesis Ex. and Comp. Synthesis Ex. | Synthesis Ex. 1 | Synthesis Ex. 1 | Synthesis Ex. 2 | Synthesis Ex. 3 |
|  | $R^2$/Methyl Group:Hydrogen (Molar Ratio) | 6:2 | 6:2 | 6.5:1.5 | 5.5:2.5 |
|  | Blended Amount (g) | 0.3 | 0.3 | 0.2 | 0.37 |
| Alkenyl group-containing polysiloxane | $R^3$ | Methyl Group | Methyl Group | Methyl Group | Methyl Group |
|  | $R^4$ | Vinyl Group | Vinyl Group | Vinyl Group | Vinyl Group |
|  | Number Average Molecular Weight | 800 | 2000 | 800 | 800 |
|  | Blended Amount (g) | 0.24 | 0.6 | 0.24 | 0.24 |
| Vinyl Group/Hydrosilyl Group (Molar Ratio) |  | 0.91 | 0.91 | 0.91 | 0.90 |
| Hydrosilylation catalyst |  | Platinum-Divinylsiloxane Complex Solution | Platinum-Divinylsiloxane Complex Solution | Platinum-Divinylsiloxane Complex Solution | Platinum-Divinylsiloxane Complex Solution |
| Evaluation of Silicone resin | State at Room Temperature | Transparent Solid | Transparent Solid | Transparent Solid | Transparent Solid |
|  | Plasticizing Temperature (° C.) | 70 | 60 | 65 | 75 |
|  | Curing Temperature (° C.) | 200 | 200 | 200 | 200 |
|  | Melting Temperature (° C.) | 80 | 73 | 75 | 85 |
|  | Heat Resistance (Reduction rate of light transmittance) 200° C., 24 h | 99 | 99 | 99 | 99 |
|  | 200° C., 168 h | 98 | 99 | 98 | 98 |

|  |  | Example and Comp. Ex. | | | |
| --- | --- | --- | --- | --- | --- |
|  |  | Comp. Ex. 1 | Comp. Ex. 2 | Comp. Ex. 3 | Comp. Ex. 4 |
| Cage Octasilsesquioxane | Synthesis Ex. and Comp. Synthesis Ex. | Comp. Synthesis Ex. 1 | Comp. Synthesis Ex. 1 | Comp. Ex. 2 | Synthesis Ex. 1 |
|  | $R^2$/Methyl Group:Hydrogen (Molar Ratio) | 6:2 | 7:1 | 5:3 | 6:2 |
|  | Blended Amount (g) | 0.3 | 0.15 | 0.45 | 0.3 |
| Alkenyl group-containing polysiloxane | $R^3$ | Methyl Group | Methyl Group | Methyl Group | Methyl Group |
|  | $R^4$ | Methyl Group | Vinyl Group | Vinyl Group | Vinyl Group |
|  | Number Average Molecular Weight | 800 | 800 | 800 | 800 |
|  | Blended Amount (g) | 0.24 | 0.24 | 0.24 | 0.24 |
| Vinyl Group/Hydrosilyl Group (Molar Ratio) |  | 0 | 0.90 | 0.91 | 0.91 |
| Hydrosilylation catalyst |  | Platinum-Divinylsiloxane Complex Solution | Platinum-Divinylsiloxane Complex Solution | Platinum-Divinylsiloxane Complex Solution | — |
| Evaluation of Silicone resin | State at Room Temperature | Opaque Oil | Transparent Oil | Transparent Solid | Opaque Oil |
|  | Plasticizing Temperature (° C.) | —*1 | —*1 | —*2 | —*1 |
|  | Curing Temperature (° C.) | —*3 | —*3 | — | —*3 |

TABLE 2-continued

| | | | | | |
|---|---|---|---|---|---|
| Melting Temperature (° C.) | | — | — | — | — |
| Heat Resistance (Reduction rate of light transmittance | 200° C., 24 h 200° C., 168 h | — — | — — | — — | — — |

*[1]Not Evaluated because the resin was in oil state
*[2]Not plasticized
*[3]Not Cured As is clear from Table 2, the silicone resins of Examples 1 to 4 had both thermoplastic and thermosetting characteristics.

On the other hand, the silicone resins of Comparative Examples 1 to 4 did not have both of the thermoplastic and thermosetting characteristics.

To be specific, in the silicone resin of Comparative Example 1, polysiloxane does not contain alkenyl groups, and therefore hydrosilylation reaction did not occur. Therefore, the obtained silicone resin did not become solid at room temperature, but became liquid at room temperature. That is, the silicone resin of Comparative Example 1 did not have thermoplastic characteristics.

The silicone resin of Comparative Example 2 had, as an average value, a molar ratio of monovalent hydrocarbon group: hydrogen in $R^2$ in the cage octasilsesquioxane as a whole of 7:1. Because the molarity of the hydrosilyl group was small, reactivity of cage octasilsesquioxane and alkenyl group-containing polysiloxane decreased, the molecular weight of the silicone resin was low, and the obtained silicone resin did not become solid at room temperature but became liquid at room temperature. That is, the silicone resin did not have thermoplastic characteristics.

The silicone resin of Comparative Example 3 had, as an average value, a molar ratio of monovalent hydrocarbon group: hydrogen in $R^2$ in the cage octasilsesquioxane as a whole of 5:3. Because the molarity of the hydrosilyl group in cage octasilsesquioxane was large, the obtained silicone resin did not show thermoplastic characteristics.

In the silicone resin of Comparative Example 4, the hydrosilylation catalyst was not blended. Therefore, hydrosilylation reaction did not occur, and the obtained silicone resin did not became solid at room temperature, but become liquid at room temperature. That is, the silicone resin of Comparative Example 4 did not have thermoplastic characteristics.

While the illustrative embodiments of the present invention are provided in the above description, such is for illustrative purpose only and it is not to be construed as limiting the scope of the present invention. Modifications and variations of the present invention that will be obvious to those skilled in the art are to be covered by the appended claims.

What is claimed is:

1. A silicone resin obtained by allowing a cage octasilsesquioxane having a group represented by formula (1) below, to react with
an alkenyl group-containing polysiloxane containing an alkenyl group in the presence of a hydrosilylation catalyst such that a hydrosilyl group of the cage octasilsesquioxane remains in a ratio at which a molar ratio of an alkenyl group of the alkenyl group-containing polysiloxane to the hydrosilyl group of the cage octasilsesquioxane is below 1:

[Chemical Formula 1]

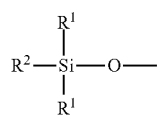

(1)

(where $R^1$ represents a monovalent hydrocarbon group, $R^2$ represents hydrogen or a monovalent hydrocarbon group, and the molar ratio of monovalent hydrocarbon group: hydrogen in $R^2$ in the cage octasilsesquioxane as a whole is, as an average value, in a range of 6.5:1.5 to 5.5:2.5).

2. The silicone resin according to claim 1, wherein the cage octasilsesquioxane is represented by formula (2) below:

[Chemical Formula 2]

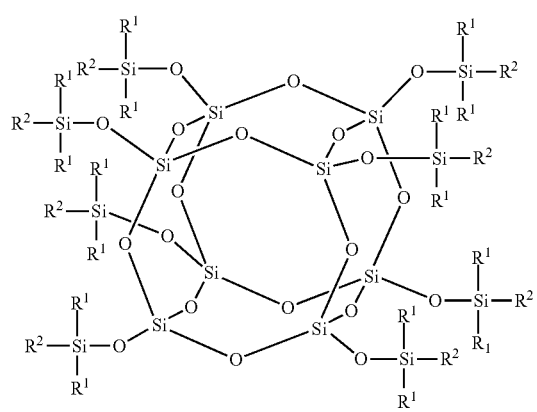

(2)

(where $R^1$ and $R^2$ are as defined in claim 1, and the molar ratio of monovalent hydrocarbon group: hydrogen in $R^2$ is as defined in claim 1).

3. The silicone resin according to claim 1, wherein the alkenyl group-containing polysiloxane is represented by formula (3) below:

[Chemical Formula 3]

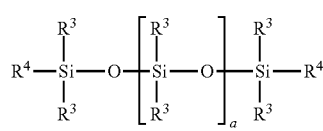

(3)

(where $R^3$ represents a monovalent hydrocarbon group, $R^4$ represents an alkenyl group, and "a" represents an integer of 1 or more).

4. A sealing material comprising the silicone resin according to claim 1, for use in sealing in an optical semiconductor element.

5. An optical semiconductor device including
an optical semiconductor element, and
a sealing material comprising a silicone resin, the sealing material sealing in the optical semiconductor element
wherein the silicone resin is obtained by allowing
a cage octasilsesquioxane having a group represented by formula (1) below to reach with
an alkenyl group-containing polysiloxane containing an alkenyl group having a molarity smaller than the molarity of a hydrosilyl group of the cage octasilsesquioxane
in the presence of a hydrosilylation catalyst,
such that a hydrosilyl group of the cage octasilsesquioxane remains in a ratio at which a molar ratio of an alkenyl group of the alkenyl group-containing polysiloxane to the hydrosilyl group of the cage octasilsesquioxane is below 1:

[Chemical Formula 1]

(1)

(where $R^1$ represents a monovalent hydrocarbon group, $R^2$ represents hydrogen or a monovalent hydrocarbon group, and the molar ratio of monovalent hydrocarbon group: hydrogen in $R^2$ in the cage octasilsesquioxane as a whole is, as an average value, in a range of 6.5:1.5 to 5.5:2.5).

* * * * *